(12) United States Patent
Sim

(10) Patent No.: US 8,526,265 B2
(45) Date of Patent: Sep. 3, 2013

(54) THREE STATE WORD LINE DRIVER FOR A DRAM MEMORY DEVICE

(75) Inventor: Jae Kwang Sim, San Jose, CA (US)

(73) Assignee: MoSys, Inc., Santa Clara, CA (US)

( * ) Notice: Subject to any disclaimer, the term of this patent is extended or adjusted under 35 U.S.C. 154(b) by 336 days.

(21) Appl. No.: 12/645,321

(22) Filed: Dec. 22, 2009

(65) Prior Publication Data

US 2011/0149673 A1  Jun. 23, 2011

(51) Int. Cl.
*G11C 8/00* (2006.01)

(52) U.S. Cl.
USPC ............ 365/230.06; 365/230.03; 365/189.09; 365/189.11

(58) Field of Classification Search
USPC .............. 365/230.03, 230.06, 189.09, 189.11
See application file for complete search history.

(56) References Cited

U.S. PATENT DOCUMENTS

| | | | |
|---|---|---|---|
| 6,768,689 B2 * | 7/2004 | Origasa .................... | 365/189.11 |
| 7,277,315 B2 | 10/2007 | Yuan et al. | |
| 7,447,104 B2 * | 11/2008 | Leung ...................... | 365/230.06 |
| 7,697,367 B2 * | 4/2010 | Hara ........................ | 365/230.06 |
| 2008/0123463 A1 * | 5/2008 | Matsubara ............... | 365/230.06 |

* cited by examiner

*Primary Examiner* — Kretelia Graham

(74) *Attorney, Agent, or Firm* — Bever, Hoffman & Harms, LLP

(57) ABSTRACT

A memory bank includes an array of memory cells, word lines for accessing the memory cells, and word line drivers coupled to the word lines. When the memory bank is being accessed, the word line drivers are coupled to receive a first supply voltage, which is applied to the non-selected word lines of the memory bank. The first supply voltage turns off access transistors of the memory cells coupled to the non-selected word lines. When the memory bank is not being accessed, the word line drivers are coupled to receive a second supply voltage, which is applied to each of the word lines of the memory bank. The second supply voltage turns off the access transistors of the memory cells coupled of the word lines. The first and second supply voltages are selected such that the first supply voltage turns off the access transistors harder than the second supply voltage.

17 Claims, 4 Drawing Sheets

THREE STATE WORD LINE DRIVER FOR A DRAM MEMORY DEVICE

FIELD OF THE INVENTION

The present invention relates to a word line driver that provides an output signal having three different states.

RELATED ART

U.S. Pat. No. 7,277,315 to Yuan et al., describes a method and circuit to reduce power consumption of DRAM word line drivers by using a dual driver control circuit to control the build-up of a word line voltage from the VDD supply voltage to higher voltage VPP. A first charge pump generates the voltage VPP1 and a second charge pump generates the voltage VPP, wherein VPP>VPP1≧VDD. The voltage VPP1 is initially driven on the word line driver from the first charge pump. After the voltage on the word line driver reaches VPP1, then the voltage VPP is driven on the word line driver from the second charge pump. In this manner, the dual driver control circuit generates the word line voltage level VPP in two stages. Because VPP1 is less than VPP, the pumping efficiency of both charge pumps is higher than the efficiency of a single charge pump that generates VPP.

It would be desirable to have word line driver circuitry that further improves the efficiency and reliability of a DRAM array.

SUMMARY

A tri-state word line driver for a memory system having one or more memory banks selectively applies one of three word line driver voltages to a corresponding word line. The word line is coupled to a corresponding row of memory cells. More specifically, the word line is coupled to the gates of access transistors of the memory cells in the row.

The tri-state word line driver applies a first word line driver voltage (V−) to the word line when the corresponding memory bank is in an active state, and the row associated with the word line is selected for access. The first word line driver voltage is selected to turn on the access transistors of the memory cells coupled to the word line.

The tri-state word line driver applies a second word line driver voltage (V1+) to the word line when the corresponding memory bank is in an active state, and the row associated with the word line is not selected for access. The second word line driver voltage is selected to prevent charge leakage through the access transistors of the memory cells coupled to the word line, taking into consideration the fact that bit lines coupled to the access transistors are pulled to full supply voltages (e.g., $V_{DD}$ and ground supply voltages).

The tri-state word line driver applies a third word line driver voltage (V2+) to the word line when the corresponding memory bank is in an inactive state. The third word line driver voltage is selected to prevent charge leakage through the access transistors of the memory cells coupled to the word line, taking into consideration the fact that bit lines coupled to the access transistors are maintained at an intermediate pre-charge voltage (e.g., $V_{DD}/2$) when the memory bank is in the inactive state.

The second word line driver voltage biases the access transistors coupled to the word line into a deeper off state than the third word line driver voltage. That is, the second word line driver voltage turns off the access transistors harder than the third word line driver voltage. As a result, the largest off state gate drive only exists within memory banks in the active state. Memory banks in the inactive state (which typically outnumber memory banks in the active state) advantageously exhibit a smaller off state gate drive (and therefore less voltage stress). As a result, the tri-state word line driver enhances the reliability of the memory cell access transistors, as well as the reliability of transistors located within the tri-state word line driver. In addition, the reduced off state gate drive associated with the third word line driver voltage advantageously improves memory cell retention time by reducing gate-induced-drain-leakage (GIDL).

The present invention will be more fully understood in view of the following description and drawings.

DETAILED DESCRIPTION

Figure 1:
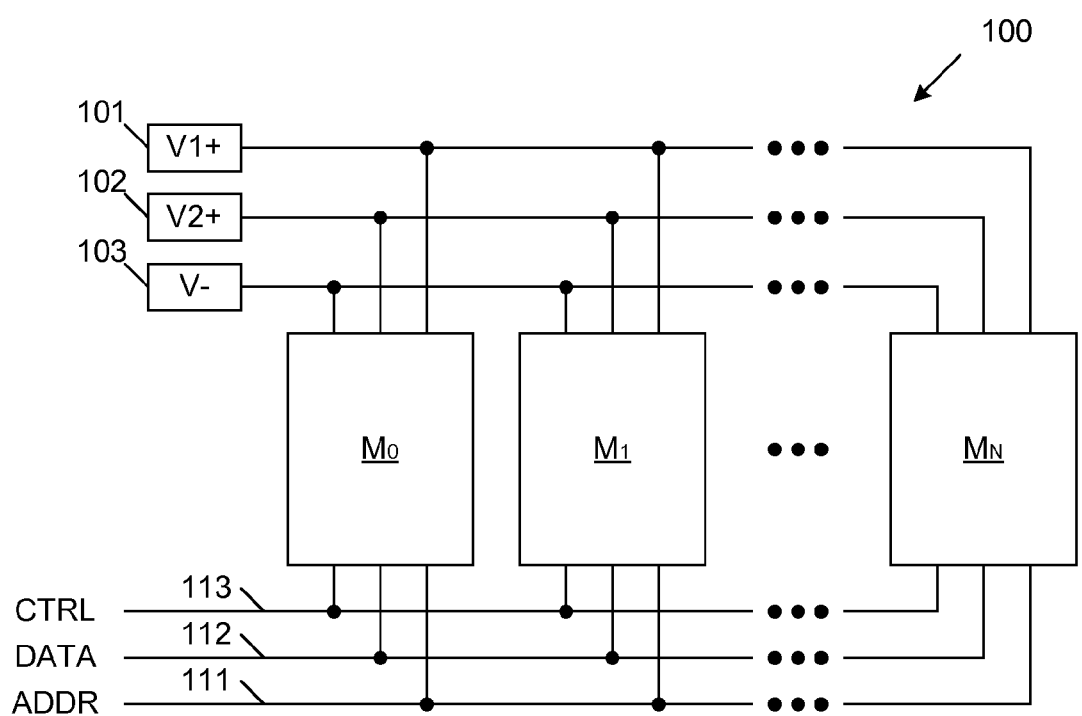
FIG. 1 is a block diagram of a multi-bank memory system in accordance with one embodiment of the present invention.

FIG. 1 is a block diagram of a multi-bank memory system 100 in accordance with one embodiment of the present invention. System 100 includes a plurality of memory banks $M_0$-$M_N$, each of which is coupled to address bus 111, data bus 112 and control bus 113. Memory banks $M_0$-$M_N$ are individually accessed in response a bank address transmitted on address bus 111. More specifically, each of memory banks $M_0$-$M_N$ is assigned a unique bank address. Each of the memory banks $M_0$-$M_N$ compares its assigned bank address with the bank address provided on address bus 111. Upon detecting that its assigned bank address matches the bank address on address bus 111, a memory bank will implement an access specified by signals on the control bus 113. These accesses may include read, write and refresh accesses, which are well known to those of ordinary skill in the art. A memory bank that is currently implementing such an access will hereinafter be referred to as an active memory bank. Memory banks that are not currently implementing an access will hereinafter be referred to as inactive memory banks.

As illustrated in FIG. 1, voltage sources 101, 102 and 103 provide corresponding word line driver supply voltages, V1+, V2+ and V− to each of the memory banks $M_0$-$M_N$. As described in more detail below, word line driver circuits within memory banks $M_0$-$M_N$ are selectively coupled to receive either word line driver supply voltage V1+ or word line driver supply voltage V2+, depending upon whether the associated memory bank is currently an active memory bank or an inactive memory bank.

Figure 2:
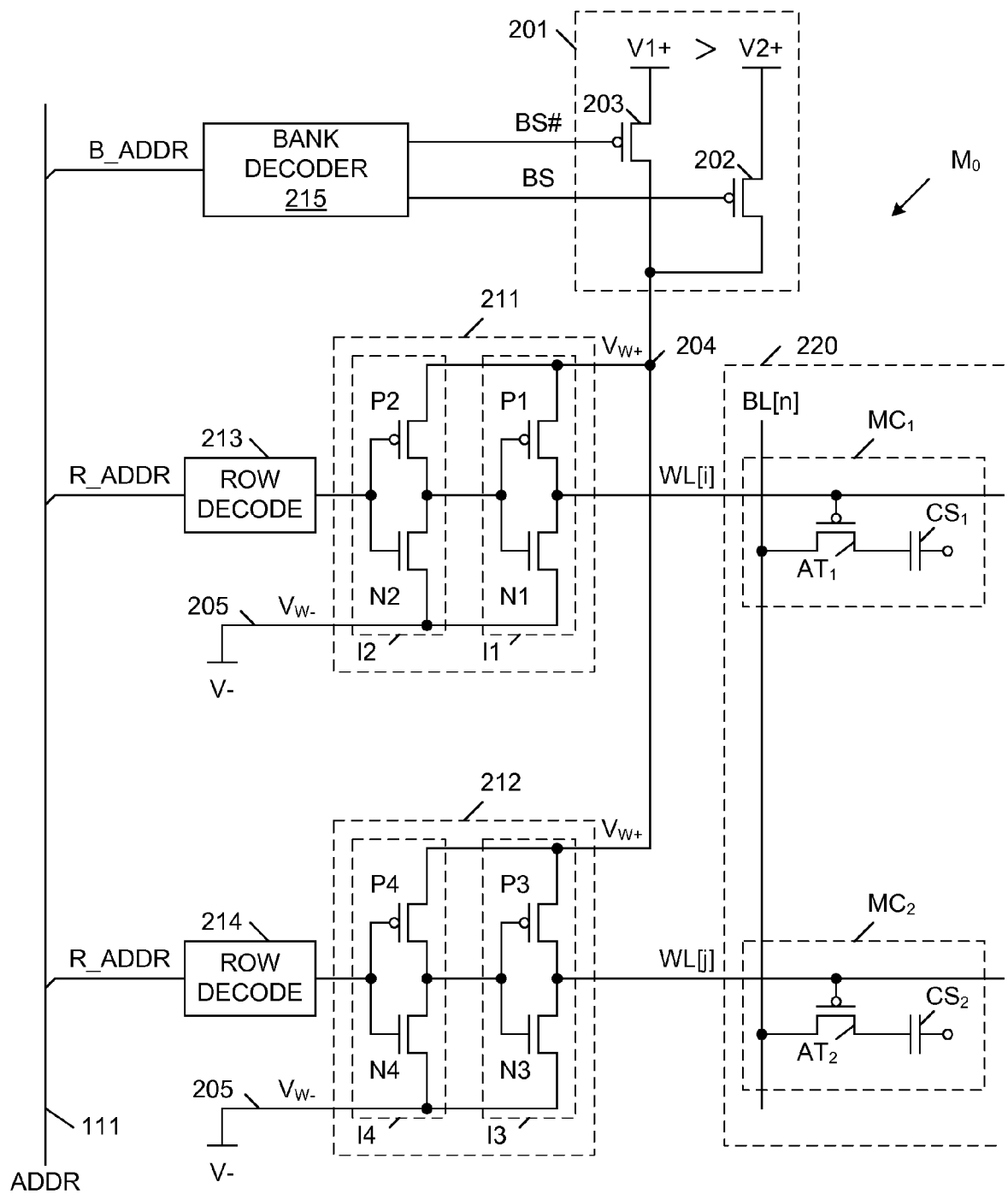
FIG. 2 is a circuit diagram of a portion of a memory bank of the multi-bank memory of FIG. 1, including word line drivers, in accordance with one embodiment of the present invention.

FIG. 2 is a circuit diagram of a portion of memory bank $M_0$ in accordance with one embodiment of the present invention. The illustrated portion of memory bank $M_0$ includes word line driver supply circuit 201, word line drivers 211-212, row decoder circuitry 213-214, memory bank decoder 215 and memory cell array 220. Memory cell array 220 includes memory cells $MC_1$ and $MC_2$, wherein memory cell $MC_1$ is located in a first row of array 220 and memory cell $MC_2$ is located in a second row of array 220. Memory cells $MC_1$ and $MC_2$ are located in the same column of array 220, and therefore share a common bit line BL[n]. Although only two rows and one column of memory cell array 220 are illustrated in FIG. 2, it is understood that memory cell array 220 typically includes many more rows and columns of memory cells (wherein each row includes a plurality of memory cells coupled to a common word line, and each column includes a plurality of memory cells coupled to a common bit line.)

Each row of memory cell array 220 is coupled to a corresponding word line. Thus, memory cell $MC_1$ is coupled to word line WL[i], and memory cell $MC_2$ is coupled to word line WL[j]. In the described examples, memory cells $MC_1$ and $MC_2$ are DRAM cells, which include PMOS access transistors $AT_1$ and $AT_2$, respectively, and charge storage structures (e.g., capacitors) $CS_1$ and $CS_2$, respectively.

Each word line is coupled to a corresponding word line driver. Thus, word line WL[i] is coupled to word line driver 211 and word line WL[j] is coupled to word line driver 212. Word line drivers 211 and 212 include series-connected inverters I1-I2 and I3-I4, respectively. The inputs of inverters I2 and I4 are coupled to outputs of row decoder circuits 213 and 214, respectively. The outputs of inverters I2 and I4 are coupled to the inputs of inverters I1 and I3, respectively. The outputs of inverters I1 and I3 are coupled to word lines WL[i] and WL[j], respectively. Although each of the word line drivers 211-212 includes two series-connected inverters in the described examples, it is understood that the word line drivers 211-212 may have other numbers of series-connected inverters (including a single inverter), in other embodiments.

Inverters I1-I4 include PMOS driver transistors P1-P4, respectively, and NMOS driver transistors N1-N4, respectively. The sources of PMOS driver transistors P1-P4 are coupled to a first word line driver supply terminal 204, which is configured to receive a word line driver voltage $V_{W+}$ from word line driver supply circuit 201. The sources of NMOS driver transistors N1-N4 are coupled to a second word line driver supply terminal 205, which is configured to receive a word line driver voltage V. In the described embodiments, the word line driver voltage $V_{W-}$ is equal to the word line driver supply voltage V− (See, FIG. 1). The word line driver voltage V− may be a negative voltage or the ground supply voltage (0 Volts). The word line driver supply voltage V− is selected such that the PMOS access transistors $AT_1$-$AT_2$ are adequately turned on when the voltage V− is applied to the gates of these PMOS access transistors during read, write and refresh accesses.

Word line driver supply circuit 201 includes PMOS transistors 202-203. PMOS transistor 203 has a source coupled to receive the word line driver supply voltage V1+, a drain coupled to word line driver supply terminal 204, and a gate coupled to receive an active-low bank select signal BS#. PMOS transistor 202 has a source coupled to receive the word line driver supply voltage V2+, a drain coupled to word line driver supply terminal 204, and a gate coupled to receive an active-high bank select signal BS.

Figure 3:
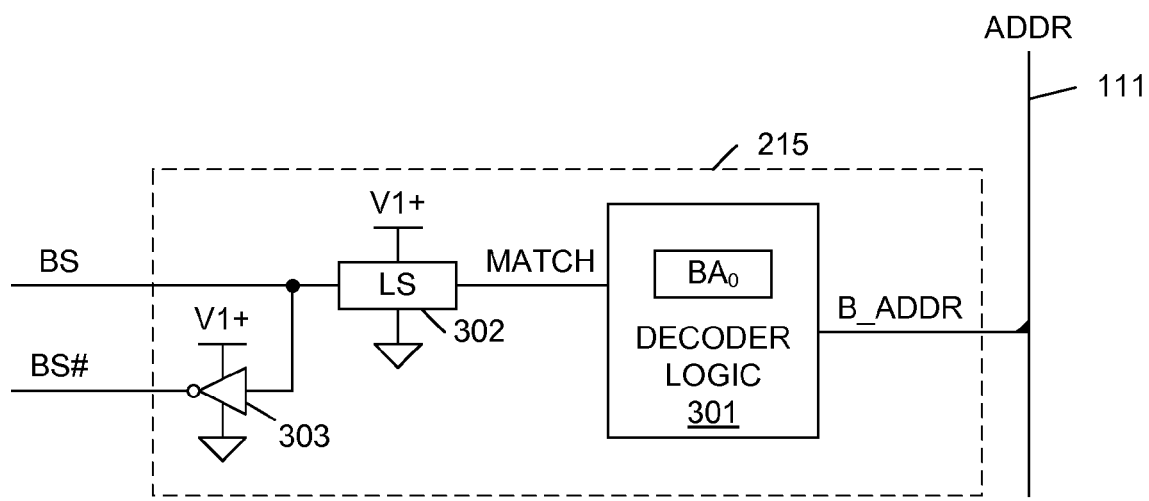
FIG. 3 is a block diagram of a control circuit that generates bank select signals, which control the voltage applied to the word line drivers of FIG. 2, in accordance with one embodiment of the present invention.

FIG. 3 is a block diagram illustrating bank decoder 215 in more detail. As described below, bank decoder 215 generates the bank select signals BS and BS# in accordance with one embodiment of the present invention. Bank decoder 215 includes decoder logic 301, level shifter 302 and inverter 303. Decoder logic 301 stores a unique bank address $BA_0$ assigned to memory bank $M_0$. Decoder logic 301 receives the bank address (B_ADDR) associated with a current access of memory system 100 on address bus 111. If decoder logic 301 determines that bank addresses $BA_0$ and B_ADDR match, decoder logic 301 activates a MATCH signal to a logic '1' state, thereby indicating that the current access of memory system 100 targets memory bank $M_0$. Conversely, if decoder logic 301 determines that the bank address B_ADDR on address bus 111 does not match the local bank address $BA_0$, then decoder logic de-activates the MATCH signal to a logic '0' state, thereby indicating that the current access of memory system 100 does not target memory bank $M_0$. A MATCH signal having a logic '1' state therefore indicates that memory bank $M_0$ is an active memory bank, while a MATCH signal having a logic '0' state indicates that memory bank $M_0$ is an inactive memory bank.

Level shifter 302 receives the MATCH signal from decoder logic 301, and in response, performs a voltage level shifting function on the MATCH signal. More specifically, when the MATCH signal is activated to a logic '1' state, level shifter 302 provides a bank select voltage BS voltage equal to the word line driver supply voltage V1+. Under these conditions, inverter 303 provides a complementary bank select voltage BS# equal to the ground supply voltage (0 Volts).

Conversely, when the MATCH signal is de-activated to a logic '0' state, level shifter 302 provides a bank select voltage BS voltage equal to the ground supply voltage. Under these conditions, inverter 303 provides a complementary bank select voltage BS# equal to the word line driver supply voltage V1+.

Thus, the bank select signal BS will have a logic '1' state (and the bank select signal BS# will have a logic '0' state) when memory bank $M_0$ is an active memory bank. Conversely, the bank select signal BS will have a logic '0' state (and the bank select signal BS# will have a logic '1' state) when memory bank $M_0$ is an inactive memory bank.

Figure 4:
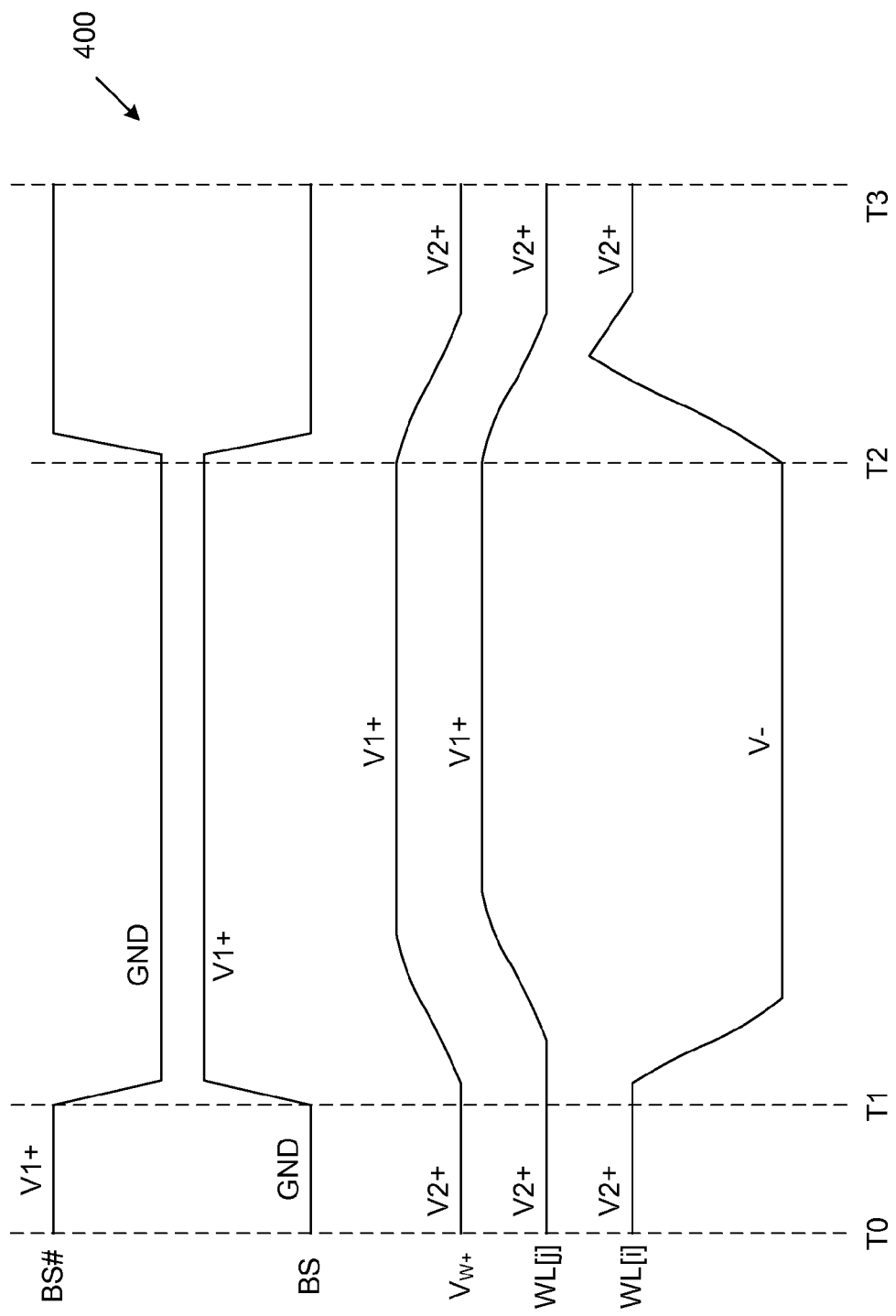
FIG. 4 is a waveform diagram illustrating signals associated with the word line drivers of FIG. 2, in accordance with one embodiment of the present invention.

The operation of the portion of memory bank $M_0$ illustrated in FIG. 2 will now be described. FIG. 4 is a waveform diagram 400 illustrating the operation of memory bank $M_0$, in accordance with one embodiment of the present invention.

Memory bank $M_0$ is an inactive memory bank between time T0 and T1 in FIG. 4. When memory bank $M_0$ is an inactive memory bank, the bank select signals BS and BS# have logic '0' and logic '1' states, respectively. Under these conditions, PMOS transistor 202 is turned on (conductive) and PMOS transistor 203 is turned off (non-conductive). As a result, the word line driver supply voltage V2+ is routed through PMOS transistor 202 to word line driver supply terminal 204. Under these conditions, the word line driver voltage $V_{W+}$ is equal to V2+. The word line driver supply voltage V2+ is less than the word line driver supply voltage V1+. For example, the word line driver supply voltage V2+ may be equal to the VDD supply voltage, while the word line driver supply voltage V1+ may be equal to VDD+$V_T$, wherein $V_T$ is the threshold voltage of the access transistors $AT_1$-$AT_2$. The exact values of the word line driver supply voltages V1+ and V2+ are selected in view of the design considerations described below.

While memory bank $M_0$ is inactive, row decoders 213 and 214 provide logic '1' values to word line drivers 211 and 212, respectively. Under these conditions, word lines WL[i] and WL[j] are pulled up to the word line driver supply voltage V2+ through turned on PMOS transistors P1 and P3, respectively. The word line driver supply voltage V2+ is sufficiently high (positive) to turn off PMOS access transistors $AT_1$ and $AT_2$ in memory cells $MC_1$ and $MC_2$, thereby retaining any charges previously stored in charge storage structures $CS_1$ and $CS_2$.

When memory bank $M_0$ is inactive, bit line BL[n] is maintained at a pre-charge voltage level of $V_{DD}/2$, thereby limiting the maximum voltage difference between bit line BL[n] and charge storage structures $CS_1$-$CS_2$ to $V_{DD}/2$. The word line driver supply voltage V2+ is selected to be high enough to prevent charge leakage between bit line BL[n] and charge storage structures $CS_1$-$CS_2$, taking into consideration that the maximum voltage difference between the bit line BL[n] and the charge storage structures $CS_1$-$CS_2$ is limited to $V_{DD}/2$.

As will become apparent in view of the following description, the word line driver voltage $V_{W+}$ is relatively low (i.e., $V_{W+}$=V2+) when memory bank $M_0$ is an inactive memory bank. As a result, the access transistors $AT_1$-$AT_2$ in memory cells $MC_1$-$MC_2$ and the transistors P1-P4 and N1-N4 in word line drivers 211-212 experience a relatively low voltage stress when memory bank $M_0$ is an inactive memory bank. The reliability of the memory cell access transistors $AT_1$-$AT_2$ and the word line driver transistors P1-P4 and N1-N4 is thereby enhanced. In addition, applying the relatively low voltage V2+ to the word lines of an inactive memory bank advantageously reduces the gate-induced-drain-leakage (GIDL) through the memory cell access transistors, thereby improving the memory cell retention time. A majority of the memory banks $M_0$-$M_N$ will be in the inactive state most of the time.

At time T1, memory bank $M_0$ starts the transition from an inactive memory bank to an active memory bank, in response to a new read/write/refresh access. When memory bank $M_0$ becomes an active memory bank, the bank select signals BS and BS# transition to logic '1' and logic '0' states, respectively. Under these conditions, PMOS transistor 203 is turned on (conductive) and PMOS transistor 202 is turned off (non-conductive). As a result, the word line driver supply voltage V1+ is routed through PMOS transistor 203 to word line driver supply terminal 204, and is therefore provided as the word line driver voltage $V_{W+}$.

Also at time T1, row decoders 213-214 decode the row address of the read/write/refresh access that caused memory bank $M_0$ to enter the active state. In the described example, this row address specifies word line WL[i], such that row decoder 213 provides a logic '0' output, and row decoder 214 provides a logic '1' output. The logic '0' output provided by row decoder 213 causes transistors P2 and N1 turn on (and transistors P1 and N2 to turn off), such that the word line driver voltage V– is applied to the selected word line WL[i] (through transistor N1). The word line driver voltage V– applied to word line WL[i] turns on PMOS access transistor $AT_1$, thereby coupling charge storage structure $CS_1$ to bit line BL[n]. Data is read from charge storage structure $CS_1$ to bit line BL[n] if the access is a read or refresh access. Conversely, data is written to charge storage structure $CS_1$ from bit line BL[n] if the access is a write access. During these accesses, the bit line BL[n] will either be pulled up to the $V_{DD}$ supply voltage, or pulled down to the $V_{SS}$ (ground) supply voltage (depending on the state of the data being read or written).

The logic '1' output provided by row decoder 214 causes transistors P3 and N4 turn on (and transistors P4 and N3 to turn off), such that the word line driver supply voltage V1+ is applied to the non-selected word line WL[j]. The word line driver supply voltage V1+ is sufficiently high (positive) to turn off PMOS access transistor $AT_2$ in memory cell $MC_2$, thereby retaining any charge previously stored in charge storage structure $CS_2$.

As described above, when memory bank $M_0$ is in the active state, the bit line BL[n] may be pulled up to the $V_{DD}$ supply voltage or pulled down to the $V_{SS}$ supply voltage. The maximum voltage difference between the bit line BL[n] and the charge storage structure $CS_2$ in a non-selected row is therefore equal to $V_{DD}$. The word line driver supply voltage V1+ is selected to be high enough to prevent charge leakage between bit line BL[n] and the charge storage structure $CS_2$ in the non-selected row, taking into consideration that the maximum voltage difference between the bit line BL[n] and the charge storage structure $CS_2$ is $V_{DD}$. In view of this requirement, the word line driver supply voltage V1+ is selected to be greater than the word line driver supply voltage V2+ in the described embodiments. As a result, word line driver supply voltage V1+ turns off access transistor $AT_2$ harder than word line driver supply voltage V2+ would turn off this access transistor $AT_2$. As a result, memory cell $MC_2$ is less susceptible to the disturb conditions introduced by the voltages present on bit line BL[n].

As illustrated in FIG. 4, the selected word line WL[i] is pulled down (through NMOS transistor N1) from an initial voltage of V2+ to a final voltage of V– when memory bank $M_0$ becomes an active memory bank. This word line voltage transition is relatively small (compared to a voltage transition from V1+ to V–). As a result, the maximum drain-to-source voltage of the NMOS transistor N1 that pulls the selected word line WL[i] down to V– is relatively small, thereby advantageously reducing hot-carrier injection into the gate dielectric of this NMOS transistor N1.

As also illustrated in FIG. 4, the non-selected word line WL[j] is pulled up from an initial voltage of V2+ to a voltage of V1+ when memory bank $M_0$ becomes an active memory bank. As described above, the higher voltage V1+ advantageously reduces charge leakage within the memory cell $MC_2$ in the non-selected row.

Although the invention has been described in connection with several embodiments, it is understood that this invention is not limited to the embodiments disclosed, but is capable of various modifications, which would be apparent to a person skilled in the art. For example, although the present invention has been described in connection with a multi-bank memory system, it is understood that the present invention could also be applied to a single-bank memory system. Moreover, although the invention has been described in connection with memory cells having PMOS access transistors, it is understood that these memory cells could be modified to have NMOS access transistors in other embodiments. In this embodiment, the word line driver supply voltages would have to be modified in accordance with the teachings of the present specification. In addition, although the described embodiments assume that all accesses are initiated on a system bus (represented by address bus 111, data bus 112, and control bus 113) it is understood that in other embodiments, refresh accesses may be initiated internally within the individual memory banks. In these embodiments, a memory bank implementing an internally initiated refresh access will still be treated as an active memory bank. Accordingly, the present invention is limited only by the following claims.

I claim:

1. A memory bank comprising:
    a word line connected to gates of access transistors in a row of memory cells, whereby a voltage applied to the word line is simultaneously applied to the gates of the access transistors in the row of memory cells;
    a word line driver having a first switching element that, when enabled, couples a first supply terminal to the word line to inhibit access to the row of memory cells;
    first means for applying a first voltage to the first supply terminal when the memory bank is in an active state; and
    second means for applying a second voltage to the first supply terminal when the memory bank is in an inactive state, wherein the first voltage turns off the memory cells harder than the second voltage.

2. The memory bank of claim 1, wherein the word line driver further comprises a second switching element that, when enabled, couples a second supply terminal to the word line to enable access to the row of memory cells.

3. The memory bank of claim 1, wherein the word line is coupled to gates of PMOS access transistors of the row of memory cells, and wherein the first voltage is greater than the second voltage.

4. The memory bank of claim 3, wherein the first voltage is greater than the second voltage by approximately a threshold voltage of the PMOS access transistors.

5. The memory bank of claim 1, wherein the word line is coupled to a row of dynamic random access memory (DRAM) cells.

6. The memory bank of claim 5, wherein the memory bank is in the active state during read, write and refresh accesses to the memory bank.

7. The memory bank of claim 1, further comprising a control circuit that generates a bank select signal that indicates whether the memory bank is in the active state or the inactive state, wherein the first and second means are controlled by the bank select signal.

8. A memory bank comprising:
a word line connected to gates of access transistors in a row of memory cells, whereby a voltage applied to the word line is simultaneously applied to the gates of the access transistors in the row of memory cells;
a word line driver coupled to the word line and a first supply terminal;
a first switch element coupled between the first supply terminal and a first voltage source that provides a first supply voltage;
a second switch element coupled between the first supply terminal and a second voltage source that provides a second supply voltage; and
a control circuit that activates the first switch element when the memory bank is being accessed, and activates the second switch element when the memory bank is not being accessed, wherein the first and second supply voltages, when applied to the word line, inhibit accesses to the memory cells.

9. The memory bank of claim 8, wherein the row of memory cells comprise PMOS access transistors, the first and second supply voltages are positive voltages, and the first supply voltage is greater than the second supply voltage.

10. The memory bank of claim 9, wherein the first supply voltage is greater than the second supply voltage by approximately a threshold voltage of the PMOS access transistors.

11. The memory bank of claim 8, wherein the memory cells are dynamic random access memory (DRAM) cells that require periodic refreshing.

12. A memory system comprising:
a plurality of memory banks, each comprising an array of memory cells arranged in rows and columns, a plurality of word lines, wherein each of the word lines is connected to gates of access transistors in a corresponding row of the memory cells, whereby a voltage applied to the word line is simultaneously applied to the gates of the access transistors in the corresponding row of memory cells, and a plurality of word line drivers coupled to the word lines; and
means for applying a first supply voltage to word line drivers in memory banks that are being accessed, and applying a second supply voltage to word line drivers in memory banks that are not being accessed, wherein the first and second supply voltages, when applied by the word line drivers to the word lines in the memory banks that are being accessed and the memory banks that are not being accessed, turn off access transistors of the memory cells, wherein the first supply voltage turns off the access transistors harder than the second supply voltage.

13. A method of operating a memory bank comprising:
applying a first supply voltage to non-selected word lines of the memory bank while the memory bank is being accessed, wherein each of the non-selected word lines applies the first supply voltage to gates of access transistors in a corresponding row of memory cells in the memory bank; and
applying a second supply voltage to word lines of the memory bank while the memory bank is not being accessed, wherein each of the word lines applies the second supply voltage to gates of access transistors in a corresponding row of memory cells in the memory bank, and wherein the first supply voltage turns off memory cells of the memory bank harder than the second supply voltage.

14. The method of claim 13, wherein the first supply voltage and the second supply voltage are positive voltages, and the first supply voltage is greater than the second supply voltage.

15. The method of claim 13, further comprising applying a third supply voltage to a selected word line of the memory bank while the memory bank is being accessed.

16. The method of claim 13, further comprising:
applying the first supply voltage to word line drivers of the memory bank while the memory bank is being accessed; and
applying the second supply voltage to word line drivers of the memory bank while the memory bank is not being accessed.

17. A method of operating a memory system comprising a plurality of memory banks comprising:
applying a first supply voltage to non-selected word lines of memory banks being accessed, whereby the first supply voltage is applied to gates of access transistors of memory cells connected to the non-selected word lines in the memory banks being accessed; and
applying a second supply voltage to word lines of memory banks not being accessed, whereby the second supply voltage is applied to gates of access transistors of memory cells in the memory banks not being accessed, wherein the first supply voltage turns off memory cells of the memory banks harder than the second supply voltage.

* * * * *